United States Patent [19]
DeMoss et al.

[11] Patent Number: 5,959,071
[45] Date of Patent: Sep. 28, 1999

[54] COMPOSITION AND METHOD FOR PRODUCING POLYTHIOETHERS HAVING PENDENT METHYL CHAINS

[75] Inventors: Suzanna Elaine DeMoss, Van Nuys; Jonathan Doherty Zook, Santa Clarita, both of Calif.

[73] Assignee: Courtaulds Aerospace, Inc., Glendale, Calif.

[21] Appl. No.: 09/052,781

[22] Filed: Mar. 31, 1998

[51] Int. Cl.$^6$ .............................. C08G 75/00; C08K 5/49
[52] U.S. Cl. .................... 528/378; 528/375; 528/376; 528/390; 528/391; 528/392; 524/92; 524/186; 524/401; 524/710; 524/714; 524/715; 524/742; 524/783
[58] Field of Search ................... 528/375, 376, 528/378, 390, 391, 392; 524/92, 186, 401, 710, 714, 715, 742, 783

[56] References Cited

U.S. PATENT DOCUMENTS

| | | | |
|---|---|---|---|
| 2,515,164 | 7/1950 | Sargent | 260/47 |
| 2,551,421 | 5/1951 | Copenhaver | 260/609 |
| 3,859,360 | 1/1975 | Oswald et al. | 260/609 |
| 4,366,307 | 12/1982 | Singh et al. | 528/373 |
| 4,609,762 | 9/1986 | Morris et al. | 568/38 |
| 5,225,472 | 7/1993 | Cameron et al. | 524/368 |

OTHER PUBLICATIONS

B. Saville, "Acid–catalyzed Addition of Thiols to Conjugated Dienes".
Oskar Nuyken and Thomas Volkel "Telechelics via addition of dithiols onto alkadienes, 2a) Base and acid catalysis", Makromol. Chem., 191, pp. 2465–2473 (1990).
Bruno Amedurl, Khalid Berrada, Bernard Boutevin, Roy D. Bowden and Lucia Pereira "Synthesis of telechelic monodispersed dithiols" Polymer Bulletin 26, pp. 377–382 (1991).
N. Kharasch, ed., "Organic Sulfur Compounds," (Pergamon Press 1961), vol. 1, pp. 260–263.
Koichi Yamaguchi, Nobuo Yamada and Yuji Minoura "Reaction of thiol to diene polymer in the presence of various catalysts" Polymer, 1973, vol. 14, Mar., pp. 87–90.
C.S. Marvel and A.H. Markhard, Jr. "Polyalkylene Sulfides. VI. New Polymers Capable of Cross–Linking" Journal of Polymer Science, vol. VI, No. 6, pp. 711–716.
C.S. Marvel and Harry N. Cripps "Polyalkylene Sulfides. X. The Reaction of Hexamethylenedithiol with 1,3–Butadiene" Journal of Polymer Science, vol. VIII, No. 3, pp. 313–320.
Gangfeng Cai, Robert G. Gastinger "Synthesis of Poly(thioether ether)s from Diallyl Ether".
S. Oae, ed., "Organic Chemistry of Sulfur", (Plenum Press 1977), pp. 129–130.
112186X: Paul F. Warner and Merline E. Bentley "Organic sulfur polymers" Aug. 14, 1970.
Abstract Of U.S. Patent No. 2,664,414—Dec. 29, 1953.
Organic Sulfur Chemistry: Structure & Mechanism, pp. 408–410 and 418.

*Primary Examiner*—Samuel A. Acquah
*Attorney, Agent, or Firm*—Jeffer, Mangels, Butler & Marmaro LLP

[57] ABSTRACT

A polythioether has the formula

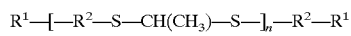

wherein
$R^1$ denotes a thiol group, a hydroxyl group, an unsubstituted amine group, a monoalkyl-substituted amine group, a monovalent radical substituted with at least one hydroxyl group, unsubstituted amine group or monoalkyl-substituted amine group, or a group that is non-reactive in the presence of an acid catalyst,
$R^2$ denotes a divalent radical, and
n is an integer from 1 to 60.

The polythioether is a liquid at room temperature and pressure.

29 Claims, No Drawings

COMPOSITION AND METHOD FOR PRODUCING POLYTHIOETHERS HAVING PENDENT METHYL CHAINS

FIELD OF THE INVENTION

The present invention relates to liquid polythioether polymers that have utility in a variety of applications requiring properties that include good fuel resistance, low temperature flexibility, temperature resistance and excellent electrical properties (low electrical conductivity, high electrical resistivity) when cured. The invention is also directed to methods for making the polymers by reacting polythiols with vinyl ethers.

BACKGROUND OF THE INVENTION

Sulfur-containing polymers are known to be well-suited for use in aerospace sealants due to their fuel resistant nature upon cross-linking. Commercially valuable sulfur containing polymers have sulfur present either as polysulfide or as polythioether linkages in the polymeric backbone. Further, to impart flexibility and liquidity, these commercially available materials incorporate oxygen either as a formal linkage or as a simple ether linkage. Particular among these materials are polythioether polyether polymers which exhibit superior thermal resistance and flexibility as compared to the polysulfide polyformal materials.

U.S. Pat. No. 4,366,307 to Singh et al. teaches the preparation of liquid polymers having excellent low temperature flexibility (low glass transition temperature $T_g$). The disclosed liquid polymers have pendent alkyl side chains and are produced by the acid-catalyzed condensation of hydroxyl-functional thioethers. The hydroxyl groups are in the β-position with respect to the thio group for increased condensation reactivity. However, the disclosed condensation reaction has a maximum yield of about 75% of the desired condensation product. Furthermore, the acid-catalyzed reaction of β-hydroxysulfide monomers yields significant quantities (typically not less than about 10%) of thermally stable and highly malodorous cyclic byproducts, such as 1-thia-4-oxa-cyclohexane. As a result, the commercial viability of the disclosed polymers is limited. The disclosed polymers also have a fairly high oxygen content, which results in water sensitivity. In addition, these polymers contain high levels of residual acid catalyst. These two factors yield materials having high electrical conductivity.

Morris et al., U.S. Pat. No. 4,609,762, describe reacting dithiols with secondary or tertiary alcohols to afford liquid polythioethers having no oxygen in the polymeric backbone. This approach reduces but does not eliminate the production of cyclic by-products. Further, by using hydroxyls of mixed reactivity, other competing side-reactions occur, such as internal dehydration to produce unsaturation and hence non-random polymerization. The disclosed polymers are less susceptible to water ingress due to their low oxygen content. However, their electrical conductivity is relatively high, again due to the presence of residual acid catalysts.

Certain high-resistivity (low-conductivity) sulfur-containing polymers and other non-sulfur containing polymers, such as polyurethanes, are also employed as "potting" compounds for applications such as coating electrical circuit boards to protect them from environmental damage. Known potting compounds suffer from a number of disadvantages. For example, lead peroxide-cured polysulfides have some fuel resistance but essentially no thermal resistance, and in addition are toxic due to the presence of residual lead oxide. Polysulfides cured using $MnO_2$ rather than $PbO_2$ avoid the toxicity problems associated with lead peroxide-cured polymers, but have reduced electrical resistivity. Polyether polyurethanes, on the other hand, have high electrical resistivity when cured but have essentially no fuel resistance. Use of two different layers to overcoat articles, with the first, underlying layer having high electrical resistivity and the second, overlying layer having high fuel resistance, has been proposed to address the foregoing problems.

A need exists for materials meeting the general performance requirement for aerospace sealants, such as room temperature liquidity, fuel resistance, and low temperature flexibility, and at the same time having minimal odor and high electrical resistance.

SUMMARY OF THE PREFERRED EMBODIMENTS

In accordance with one aspect of the present invention, there is provided a polythioether having the formula I $$R^1\text{—}[\text{—}R^2\text{—}S\text{—}CH(CH_3)\text{—}S\text{—}]_n\text{—}R^2\text{—}R^1 \qquad \text{I}$$

wherein $R^1$ denotes a thiol group, a hydroxyl group, an unsubstituted amine group, a monoalkyl-substituted amine group, a monovalent radical substituted with at least one hydroxyl group, unsubstituted amine group or monoalkyl-substituted amine group, or a group that is non-reactive in the presence of an acid catalyst, $R^2$ denotes a divalent radical, and n is an integer from 1 to 60, the polythioether being a liquid at room temperature and pressure.

In a more specific embodiment, the divalent radical is selected from the group consisting of a $C_{2-6}$ n-alkylene group, a $C_{3-6}$ branched alkylene group, a $C_{6-8}$ cycloalkylene group, a $C_{6-10}$ alkylcycloalkylene group, a —[(—$CH_2$—)$_p$—X—]$_q$—(—$CH_2$—)$_r$— group, or a —[(—$CH_2$—)$_p$—X—]$_q$—(—$CH_2$—)$_r$— group in which at least one —$CH_2$— unit is substituted with a methyl group. In the foregoing, X denotes one selected from the group consisting of O, S and —$NR^3$—

$R^3$ denotes H or methyl, p is an integer from 2 to 6, q is an integer from 1 to 5, and r is an integer from 2 to 10.

In a preferred embodiment, the inventive compound is a dithiol in which $R^1$ is —SH.

In accordance with another aspect of the present invention, there is provided a polyfunctional polythioether having the formula II $$B\text{—}(\text{—}S\text{—}[\text{—}R^2\text{—}S\text{—}CH(CH_3)\text{—}S\text{—}]_n\text{—}R^2\text{—}R^1)_z \qquad \text{II}$$

wherein $R^1$ denotes a thiol group, a hydroxyl group, an unsubstituted amine group, a monoalkyl-substituted amine group, a monovalent radical substituted with at least one hydroxyl group, unsubstituted amine group or monoalkyl-substituted amine group, or a group that is non-reactive in the presence of an acid catalyst, $R^2$ denotes a divalent radical, n is an integer from 1 to 60, z is an integer from 3 to 6, and B denotes a z-valent residue of a polyfunctionalizing agent.

In a more specific embodiment, z is 3, and the polyfunctionalizing agent thus is a trifunctionalizing agent. In another more specific embodiment, the average functionality of the polythioether ranges between about 2.05 and about 3.00.

There are also provided methods of producing the foregoing polythioethers.

Thus, in accordance with a further aspect of the present invention, a polythioether is produced by reacting (n) moles of a compound having the formula III $$HS-R^2-SH \text{ III} \qquad \qquad III$$

or a mixture of at least two different compounds having the formula III, and (n−1)/m moles of a compound having the formula IV $$R^8-[-O-CH=CH_2]m \qquad \qquad IV$$

wherein m is an integer $\geq 1$, and $R^8$ denotes an m-valent radical, or a mixture of at least two different compounds having the formula IV, in the presence of an acid catalyst.

This method affords a dithiol, e.g., a polythioether having two terminal —SH groups ($R^1$=thiol).

$R^8$ can be any of a wide range of m-valent radicals, so long as the resulting compound of formula IV is capable of serving as a donor for vinyl groups in the reaction.

In accordance with an additional aspect of the present invention, a polythioether is produced by reacting (n) moles of a compound having the formula III, or a mixture of at least two different compounds having the formula III, with (n−1)/m moles of a compound having the formula IV, or a mixture of at least two different compounds having the formula IV, in the presence of an acid catalyst to produce a difunctional liquid polythioether, and subsequently reacting the polythioether so formed with a polyfunctionalizing agent to form a polyfunctional polythioether.

The foregoing method affords a polythiol, analogous to the dithiol produced by the preceding method.

Polythioethers prepared according to the foregoing methods are also provided.

Di- and polyfunctional polythioethers having terminal groups other than thiols, that is, "capped" polythioethers, are also provided according to the present invention.

Preferred embodiments include polythioethers according to formula I wherein $R^1$ denotes —S—(—CH$_2$—)$_2$—O—$R^4$, and $R^4$ denotes a monovalent radical substituted with at least one hydroxyl group, unsubstituted amine group or monoalkyl-substituted amine group, or a group that is non-reactive in the presence of an acid catalyst.

Methods of producing capped polythioethers are also provided. Thus, in accordance with still another aspect of the present invention, a capped difunctional polythioether is produced by reacting (n) moles of a compound having the formula III, or a mixture of at least two different compounds having the formula III, with (n—1)/m moles of a compound having the formula IV, or a mixture of at least two different compounds having the formula IV, in the presence of an acid catalyst to produce an uncapped polythioether, and subsequently reacting said uncapped thioether with about 0.05 to about 2 moles of a compound having the formula V $$CH_2=CH-O-R^4 \qquad \qquad V$$

or a mixture of two different compounds having the formula V, wherein $R^4$ denotes $C_{1-6}$ n-alkyl which is unsubstituted or substituted with at least one —OH or —NHR$^5$ group, and $R^5$ denotes H or a $C_{1-6}$ n-alkyl group, in the presence of a free-radical catalyst.

In accordance with yet another aspect of the present invention, a capped polyfunctional polythioether is produced by reacting (n) moles of a compound having the formula III, or a mixture of at least two different compounds having the formula III, with (n−1)/m moles of a compound having the formula IV, or a mixture of at least two different compounds having the formula IV, in the presence of an acid catalyst to produce a difunctional liquid polythioether, then reacting the polythioether so formed with a z-valent polyfunctionalizing agent, wherein z is an integer from 3 to 6, to form a polyfunctional polythioether, and subsequently reacting the polyfunctional polythioether with about 0.05 to about z moles of a compound having the formula V, or a mixture of two different compounds having the formula V, in the presence of a free-radical catalyst.

The uncapped di- and polythiol polythioethers described above are useful per se, and are also useful in producing additional polythioethers. Thus, in accordance with another aspect of the present invention, there is provided a method of producing a polythioether including the step of reacting (n +1) moles of an uncapped dithiol compound as described above, or a mixture of at least two such compounds, with (n) moles of a compound having the formula VI $$CH_2=CH-O-[-R^{11}-O-]_k-CH=CH_2 \qquad \qquad VI$$

wherein $R^{11}$ denotes a $C_{2-6}$ n-alkyl, $C_{2-6}$ branched alkylene, $C_{6-8}$ cycloalkylene or $C_{6-10}$ alkylcycloalkylene group, a —[(—CH$_2$—)$_p$—X—]$_q$—(—CH$_2$—)$_r$— group, or a —[(—CH$_2$—)$_p$—X—]$_q$—(—CH$_2$—)$_r$— group in which at least one —CH$_2$— unit is substituted with a methyl group, X denotes one selected from the group consisting of O, S and —NR$^3$—, $R^3$ denotes H or methyl, p is an integer from 2 to 6, q is an integer from 1 to 5, r is an integer from 2 to 10, and k is a rational number from 0 to 10, or a mixture of at least two different compounds having the formula VI, in the presence of a catalyst selected from the group consisting of free-radical catalysts, ionic catalysts and ultraviolet light.

In accordance with still another aspect of the present invention, there is provided a method of producing a polythioether including the step of reacting (n) moles of an uncapped dithiol polythioether as described above, or a mixture of at least two such compounds, with (n+1) moles of a compound having the formula VI, or a mixture of at least two different compounds having the formula VI, in the presence of a catalyst selected from the group consisting of free-radical catalysts, ionic catalysts and ultraviolet light.

Uncapped difunctional polythioethers produced according to the foregoing methods are also provided.

In accordance with a further aspect of the present invention, there is provided a method of producing a polythioether including the step of reacting (n+1) moles of an uncapped dithiol polythioether as described above, or a mixture of at least two different compounds, with (n) moles of a compound having the formula VI, or a mixture of at least two different compounds having the formula VI, and about 0.05 to about 2 moles of a compound having the formula V, or a mixture of two different compounds having the formula V, in the presence of a catalyst selected from the group consisting of free-radical catalysts, ionic catalysts and ultraviolet light.

In accordance with yet another aspect of the present invention, there is provided a method of producing a polythioether comprising the step of reacting (n) moles of an uncapped dithiol polythioether as described above, or a mixture of at least two different such compounds, with (n +1) moles of a compound having the formula VI, or a mixture of at least two different compounds having the formula VI, and about 0.05 to about 2 moles of a compound having the formula VII

HS—R⁴    VII or a mixture of two different compounds having the formula VII, in the presence of a catalyst selected from the group consisting of free-radical catalysts, ionic catalysts and ultraviolet light.

Capped difunctional polythioethers produced according to the foregoing methods are also provided.

Analogous uncapped and capped polyfunctional polythioethers, produced using appropriate polyfunctionalizing agents, are also provided.

Other objects, features and advantages of the present invention will become apparent to those skilled in the art from the following detailed description. It is to be understood, however, that the detailed description and specific examples, while indicating preferred embodiments of the present invention, are given by way of illustration and not limitation. Many changes and modifications within the scope of the present invention may be made without departing from the spirit thereof, and the invention includes all such modifications.

DETAILED DESCRIPTION OF THE PREFERRED EMBODIMENTS

It has been suggested in the literature that acid-catalyzed addition of thiols to olefins affords side-chain containing, and hence liquid, Markovnikov reaction product, in contrast to the linear, often solid anti-Markovnikov reaction products expected from free-radical catalyzed addition reactions between thiols and olefins. Previous work has suggested that the Markovnikov addition of a dithiol to a divinyl ether yields a polythioether with S,O ketal units. See, e.g., Nuyken, O. et al., *Makromol. Chem.* 191, 2465–2473 (1990). It has surprisingly been discovered that, with proper selection of the starting materials, the reaction can be made to continue until a thermodynamically stable polymer having only S,S ketal units results, although S,O ketal linkages may form as intermediate products. The polymers so formed are liquids at room temperature and pressure, have desirable physical and rheological properties preferably including low $T_g$, and furthermore have little residual monomers or cyclic by-products and hence are low in odor.

According to the present invention, polythioethers are provided that are liquid at room temperature and pressure and have excellent low temperature flexibility (low $T_g$) and fuel resistance. As used herein, the term "room temperature and pressure" denotes approximately 77° F. (25° C.), and 1 atmosphere.

The present invention provides difunctional polythioethers having the formula I

R¹—[—R²—S—CH(CH₃)—S—]ₙ—R²—R¹    I wherein
  R¹ denotes a thiol group, a hydroxyl group, an unsubstituted amine group, a monoalkyl-substituted amine group, a monovalent radical substituted with at least one hydroxyl group, unsubstituted amine group or monoalkyl-substituted amine group, or a group that is non-reactive in the presence of an acid catalyst,
  R² denotes a divalent radical, and
  n is an integer from 1 to 60,
  the polythioether being a liquid at room temperature and pressure.

Preferably, a polythioether polymer according to the invention has a glass transition temperature $T_g$ that is not greater than −50° C. More preferably, the $T_g$ of the inventive polymer is not greater than −55° C. Very preferably, the $T_g$ of the inventive polymer is not greater than −60° C. Low $T_g$ is indicative of good low temperature flexibility, which can be determined by known methods, for example, by the methods described in AMS (Aerospace Material Specification) 3267 §4.5.4.7, MIL-S (Military Specification) −8802E §3.3.12 and MIL-S-29574, and by methods similar to those described in ASTM (American Society for Testing and Materials) D522-88.

The polythioethers of the invention exhibit very desirable fuel resistance characteristics when cured. One measure of the fuel resistance of the inventive polymers is their percent volume swell after prolonged exposure to a hydrocarbon fuel, which can be quantitatively determined using methods similar to those described in ASTM D792 or AMS 3269. Thus, in a preferred embodiment, the inventive polymers have, when cured, a percent volume swell not greater than 25% after immersion for one week at 140° F. (60° C.) and ambient pressure in jet reference fluid (JRF) type 1. Very preferably, the percent volume swell of the cured polymers is not greater than 20%.

JRF type 1, as employed herein for determination of fuel resistance, has the following composition (see AMS 2629, issued Jul. 1, 1989), section 3.1.1 et seq., available from SAE (Society of Automotive Engineers, Warrendale, Pa.):

| | |
|---|---|
| Toluene | 28 ± 1% by volume |
| Cyclohexane (technical) | 34 ± 1% by volume |
| Isooctane | 38 ± 1% by volume |
| Tertiary dibutyl disulfide (doctor sweet) | 1 ± 0.005% by volume |
| Tertiary butyl mercaptan | 0.015% ± 0.0015 by weight of the other four components |

Desirably, the inventive polythioethers have number average molecular weights ranging from about 200 to 20,000, preferably about 1,000 to 10,000, very preferably about 2,000 to 5,000.

In a preferred embodiment, the inventive polymers also have excellent electrical resistivity properties. Particularly, the inventive polymers have volume resistivities when cured of at least about $1 \times 10^{11}$ Ω, more particularly at least about $1 \times 10^{13}$ Ω.

In formula I R² denotes a divalent radical. More specific divalent radicals R² are selected from the group consisting of a $C_{2-6}$ n-alkylene group, a $C_{3-6}$ branched alkylene group, a $C_{6-8}$ cycloalkylene group, a $C_{6-10}$ alkylcycloalkylene group, a —[(—CH₂—)ₚ—X—]ᵩ—(—CH₂—)ᵣ—group, or a —[(—CH₂—)ₚ—X—]ᵩ—(—CH₂—)ᵣ—group in which at least one —CH₂— unit is substituted with a methyl group, and wherein
  X denotes one selected from the group consisting of O, S and —NR³—, $R^3$ denotes H or methyl, p is an integer from 2 to 6, q is an integer from 1 to 5, and r is an integer from 2 to 10.

In a particular preferred embodiment, $R^4$ denotes —SH. That is, the polythioether is an uncapped dithiol polythioether having the structure $$HS-[-R^2-S-CH_2(CH_3)-S-]_n-R^2-SH$$

The compounds of formula I are difunctional compounds. Polyfunctional compounds are also provided according to the present invention. The polyfunctional compounds have the formula II $$B-(-S-[-R^2-S-CH(CH_3)-S-]_n-R^2-R^1)_z \qquad II$$

wherein $R^1$ and $R^2$ are as defined with respect to formula I above, and wherein n is an integer from 1 to 60, z is an integer from 3 to 6, and B denotes a z-valent residue of a polyfunctionalizing agent.

Preferred polyfunctional compounds of formula II include those in which $R^1$ is —SH, i.e., polythiol polythioethers.

The term "polyfunctionalizing agent" as employed herein denotes a compound having more than two reactive moieties, and in particular more than two moieties that are reactive with compounds of the formula I in which $R^1$=—SH. The polyfunctionalizing agent preferably includes from 3 to 6 such moieties, and thus is denoted a "z-valent" polyfunctionalizing agent, where z is the number (preferably from 3 to 6) of such moieties included in the agent, and hence the number of separate branches which the polyfunctional polythioether comprises. The polyfunctionalizing agent can be represented by the formula $$B-(R^9)z$$

where $R^9$ denotes a moiety that is reactive with a compound of the formula I, and preferably with a terminal —SH group. Each $R^9$ group can be the same or different. B is the z-valent residue of the polyfunctionalizing agent, i.e., the portion of the agent other than the reactive moieties $R^9$.

Specific polyfunctionalizing agents include trifunctionalizing agents, that is, compounds with z=3. Preferred trifunctionalizing agents include trithiols.

Other useful polyfunctionalizing agents include the polythiols described in U.S. Pat. No. 4,366,307, U.S. Pat. No. 4,609,762 and U.S. Pat. No. 5,225,472, the disclosures of each of which are incorporated in their entireties herein by reference.

Polyfunctionalizing agents having more than three reactive moieties (i.e., z >3) afford "star" polythioethers and hyperbranched polythioethers.

Polythioethers as described above have a wide range of average functionality. For example, trifunctionalizing agents can afford average functionalities from about 2.05 to 3.0, preferably about 2.1 to 2.6. Wider ranges of average functionality can be achieved by using quaternary or higher polyfunctionalizing agents. Functionality will also be affected by factors such as stoichiometry, as is known to those skilled in the art.

The di- and polythiol polythioethers of the present invention are preferably prepared by a method that includes the step of reacting a dithiol compound with a vinyl donor compound in the presence of an acid catalyst. According to a first method of the invention for producing a dithiol polythioether, (n) moles of a dithiol compound having the formula III $$HS-R^2-SH \qquad II$$

or a mixture of at least two different compounds having the formula III, and (n–1)/m moles of a compound having the formula IV $$R^8-[-O-CH=CH_2]_m \qquad IV$$

wherein m is an integer $\geq 1$, and $R^8$ denotes an m-valent radical, or a mixture of at least two different compounds having the formula IV, in the presence of an acid catalyst.

The compounds of formula III are dithiol compounds. In general, the compounds are dithiols which do not cyclize (i.e., react with themselves) or react with a vinyl ether in the presence of an acid catalyst to form a cyclic compound that is stable at 180° F. That is, the selected dithiol does not form, by reaction with itself or with a vinyl ether, a ring that resists further reaction, in particular ring-opening. Smaller rings, in particular 5- and 6-member rings, are particularly stable, and thus, the dithiol compound of formula II of the invention is preferably not a $C_2$ or $C_3$ dithiol, e.g., ethanedithiol or 1,3-propanedithiol.

Preferred dithiols include those compounds in which the divalent radical $R_2$ is $C_{4-6}$ n-alkyl, i.e., 1,4-butanedithiol, 1,5-pentanedithiol and 1,6-hexanedithiol. Other useful dithiols include those in which $R^2$ is $C_{6-8}$ cycloalkyl or $C_{6-10}$ alkylcycloalkyl, for example, dipentenedimercaptan and ethylcyclohexyldithiol (ECHDT).

Further preferred dithiols include one or more heteroatom substituents in the carbon backbone, that is, dithiols in which $R^2$ is —[(—CH$_2$—)$_p$—X—]$_q$—(—CH$_2$—. In the foregoing, X preferably is S or O and more preferably is S. Preferably, the indices p and r are equal, and very preferably both have the value of 2. $R^2$ groups of the formula —[(—CH$_2$—)$_p$—X—]$_q$—(—CH$_2$—)$_R$—in which one or more of the methylene groups are further substituted with a methyl group are also useful. Particularly preferred exemplary dithiols of this type include dimercaptodiethylsulfide (DMDS) (p, r=2, q =1, X=S).

Oxygen is a possible heteroatom substituent. However, if compounds containing oxygen as a heteroatom in $R^1$ are employed, care must be taken to prevent excessive cleavage of the compounds during the first reaction. This is because the C—O—C bonds of such compounds are less stable under the acidic conditions of the first reaction, and thus subject to cleavage. In the second reaction, however, the acid is removed, and thus the C—O—C bonds are no longer subject to cleavage. Accordingly, compounds containing oxygen as a heteroatom in $R^2$ should be chosen such that the rate of cleavage is lower than the rate of the first reaction.

The compounds of formula IV are vinyl ethers. In formula V, $R^8$ is not limited to any particular group, as long as the compound V is capable of serving as a donor of vinyl groups.

More particular compounds of the formula IV are those having the formula IVa $$CH_2=CH-[-R^{10}-O-]_s-CH=CH_2 \qquad IVa$$

wherein $R^{10}$ denotes methylene, a divalent $C_{2-6}$ n-alkyl, $C_{2-6}$ branched alkyl, $C_{6-8}$ cycloalkyl or $C_{6-10}$ alkylcycloalkyl group, or —[(—CH$_2$—)$_p$—Y—]$_q$—(—CH$_2$—)$_r$—, Y denotes one selected from the group consisting of O, S and —NR$^7$—, R$^7$ denotes H or a C$_{1-6}$ n-alkyl group, s is a rational number from 0 to 10, and p, q and r are as defined previously.

Preferred vinyl ethers of formula IV include those compounds having at least one vinyl group, most preferably from 1 to 4 vinyl groups (i.e., those compounds in which m is an integer from 1 to 4). It is also possible to employ commercially available divinyl ether mixtures in producing polythioethers according to the invention. Such mixtures are characterized by a non-integral average value for the number of alkoxy units per molecule. Thus, s in formula IVa can also take on non-integral, rational values between 0 and 10, preferably between 1 and 10, very preferably between 1 and 4, particularly between 2 and 4.

Exemplary divinyl ethers include those compounds in which R$^8$ is C$_{2-6}$ n-alkyl or C$_{2-6}$ branched alkyl. Preferred divinyl ethers of this type include ethylene glycol divinyl ether (EG-DVE); butanediol divinyl ether (BD-DVE); hexanediol divinyl ether (HD-DVE); diethylene glycol divinyl ether (DEG-DVE); triethylene glycol diethyl ether (TEG-DVE); and tetraethylene glycol divinyl ether. Useful divinyl ether blends include "PLURIOL®" type blends such as PLURIOL® E-200 divinyl ether (available from BASF), for which R$^{10}$=ethyl and s=3.8, as well as "DPE" polymeric blends such as DPE-2 and DPE-3 (available from International Specialty Products, Wayne, N.J.). Of these, DEG-DVE and PLURIOL® E-200 are particularly preferred.

Useful vinyl ethers in which R$^8$ is C$_{2-6}$ branched alkyl can be prepared by reacting a polyhydroxy compound with acetylene. Exemplary compounds of this type include compounds in which R- is an alkyl-substituted methylene group such as —CH(CH$_3$)—.

Other useful divinyl ethers include compounds in which R$^8$ is polytetrahydrofuryl (poly-THF), or polyoxyalkylene, preferably having an average of about 3 monomer units.

Two or more compounds of the formula III, as well as two or more compounds of the formula IV, can be used in the foregoing methods. All such combinations of compounds are contemplated as being within the scope of the invention.

The reaction between the compounds of formulas III and IV is catalyzed by an acid catalyst. Preferred catalysts include HCl, ZnCl$_2$ or other Lewis acids. Other useful acid catalysts include sulfuric acid, phosphoric acid, phosphorous acid, and other non-oxidizing mineral acids.

A polyfunctional polythioether of the invention is produced by reacting n moles of a compound having the formula III with (n−1)/m equivalents of a compound having the formula IV to form a first reaction mixture. This first reaction mixture is reacted in the presence of an acid catalyst to form a difunctional liquid polythioether. Next, the polythioether so formed is combined with a z-valent polyfunctionalizing agent as described herein to form a second reaction mixture. The second reaction mixture is then reacted in the presence of a catalyst, preferably a free-radical catalyst, to form a liquid polyfunctional polythioether.

The foregoing methods afford di- and polyfunctional polythioethers of the invention in which R$^1$ is —SH, i.e., di- and polythiol polythioethers. Compounds of the invention which include an R$^1$ group other than —SH are also provided. Such R$^1$ groups include, for example, hydroxyl groups, unsubstituted amine groups, monoalkyl-substituted amine groups, monovalent radicals substituted with at least one hydroxyl group, unsubstituted amine group or monoalkyl-substituted amine group, or groups that are non-reactive in the presence of an acid catalyst, These compounds are denoted "capped" compounds. Capped compounds can be fully capped (no remaining free terminal —SH groups) or partially capped.

Preferred capped compounds according to formulas I and II of the present invention include those in which R$^1$ denotes —S—(—CH$_2$—)$_2$—O—R$^4$, and R$^4$ denotes a monovalent radical substituted with at least one hydroxyl group, unsubstituted amine group or monoalkyl-substituted amine group, or a group that is non-reactive in the presence of an acid catalyst. More particular preferred embodiments include compounds in which R$^4$ denotes C$_{1-6}$ n-alkyl which is unsubstituted or substituted with at least one —OH or —NHR$^5$ group, and R$^5$ denotes H or a C$_{1-6}$ n-alkyl group.

Capped di- and polyfunctional polythioethers can be prepared by reacting the respective uncapped di- and polythiol polythioethers with an appropriate capping agent, preferably in the presence of a free-radical catalyst. Preferably, the capped compounds are prepared by reacting the respective uncapped compounds with about 0.05 to about 2 moles (for a dithiol) or about 0.05 to about z moles (for a z-valent polythiol) of a compound having the formula V

or a mixture of two different compounds having the formula V, in the presence of a free-radical catalyst.

Compounds of the formula V are monovinyl ethers, which react with terminal thiol groups to cap the polythioether polymer. Preferred monovinyl ethers of the formula V include amino- and hydroxyalkyl vinyl ethers, such as 3-aminopropyl vinyl ether and 4-hydroxybutyl vinyl ether (butanediol monovinyl ether), as well as unsubstituted alkyl vinyl ethers such as ethyl vinyl ether. Use of 2 moles of compounds of the formula V (for dithiols) or z moles (for z-valent polythiols) per mole of polymer affords fully capped polymers, while use of lesser amounts results in partially capped polymers.

In the foregoing method, useful free radical catalysts for use in reacting the second reaction mixture include azo compounds, for example azobisnitrile compounds such as azo(bis)isobutyronitrile (AIBN); organic peroxides such as benzoyl peroxide and t-butyl peroxide; and inorganic peroxides such as hydrogen peroxide. The reaction can also be effected by irradiation with ultraviolet light either with or without a cationic photoinitiating moiety. Ionic catalysis methods, using either inorganic or organic bases, e.g., triethylamine, also yield materials useful in the context of this invention.

The foregoing reactions preferably are carried out at a temperature from about 30 to about 120° C. for a time from about 2 to about 24 hours. Very preferably the reaction is carried out at a temperature from about 70 to about 90° C. for a time from about 2 to about 6 hours.

Since the inventive reaction is an addition reaction, rather than a condensation reaction, the reaction typically proceeds substantially to completion, i.e., the inventive polythioethers are produced in yields of approximately 100%. No or substantially no undesirable by-products are produced. In particular, the reaction does not produce appreciable amounts of malodorous cyclic by-products such as are characteristic of known methods for producing polythioethers. Moreover, the polythioethers prepared according to the invention are substantially free of residual acidic catalyst. This lack of residual catalyst prevents water activated degradation of the polythioether to produce malodorous cyclic compounds. Thus, the inventive polythioethers are characterized both by thermal stability and by low odor.

The uncapped di- and polythiol polythioethers described above, in addition to being useful per se, are also useful in producing additional polythioethers by reaction with divinyl ethers according to the various particular methods described in copending, commonly assigned U.S. patent application Ser. No. 08/928,972, which is incorporated herein in its entirety by reference.

In one method, a polythioether is produced by reacting (n+1) moles of an uncapped dithiol compound of formula I, described above, or a mixture of at least two such compounds, with (n) moles of a compound having the formula VI

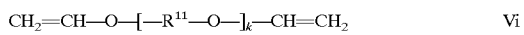

wherein
- $R^{11}$ denotes a $C_{2-6}$ n-alkyl, $C_{2-6}$ branched alkylene, $C_{6-8}$ cycloalkylene or $C_{6-10}$ alkylcycloalkylene group, a $—[(—CH_2—)_p—X—]_q'(—CH_2—)_r—$group, or a $—[(—CH_2—)_p—X—]_q—(—CH_2—)_r—$group in which at least one $—CH_2—$unit is substituted with a methyl group,
- X denotes one selected from the group consisting of O, S and $—NR^3—$
- $R^3$ denotes H or methyl,
- p is an integer from 2 to 6,
- q is an integer from 1 to 5,
- r is an integer from 2 to 10, and
- k is a rational number from 0 to 10,
- or a mixture of at least two different compounds having the formula VI, in the presence of a catalyst selected from the group consisting of free-radical catalysts, ionic catalysts and ultraviolet light. This method affords polythioethers which are thiol-terminated.

According to another method, a vinyl-terminated polythioether is produced by using an excess of the compound(s) of formula VI. Thus, (n) moles of an uncapped dithiol polythioether of formula I as described above, or a mixture of at least two such compounds, are reacted with (n+1) moles of a compound having the formula VI, or a mixture of at least two different compounds having the formula VI, in the presence of a catalyst selected from the group consisting of free-radical catalysts, ionic catalysts and ultraviolet light.

The foregoing compounds are uncapped polythioethers. Both the thiol-terminated compounds and the vinyl-terminated compounds can be further reacted to afford capped polythioethers. In accordance with one method, a capped thiol-terminated compound is produced by reacting (n+1) moles of an uncapped dithiol polythioether of formula I above, or a mixture of at least two different such compounds, with (n) moles of a compound having the formula VI, or a mixture of at least two different compounds having the formula VI, and about 0.05 to about 2 moles of a compound having the formula V, or a mixture of two different compounds having the formula V, per mole of polymer. The foregoing ingredients preferably are reacted in the presence of a catalyst such as a free-radical catalyst, an ionic catalyst or ultraviolet light.

Similarly, a capped vinyl-terminated compound is produced by reacting (n) moles of an uncapped dithiol polythioether of formula I above, or a mixture of at least two different such compounds, with (n+1) moles of a compound having the formula VI, or a mixture of at least two different compounds having the formula VI, and about 0.05 to about 2 moles, per mole of polymer, of a compound having the formula VII

 HS—$R^4$      VII or a mixture of two different compounds having the formula VII, per mole of polymer, in the presence of a catalyst as set forth above.

The foregoing compounds are difunctional polythioethers. Analogous uncapped and capped polyfunctional polythioether are produced using appropriate polyfunctionalizing agents in the manner described herein. In addition, other polyfunctionalizing agents which are reactive with terminal vinyl groups can also be used, as can polyfunctional agents of mixed reactivity (i.e., agents including moieties that react with thiols and others that react with vinyl groups). Such additional polyfunctionalizing agents are described in U.S. patent application Ser. No. 08/928,972.

Polythioethers according to the invention preferably are formulated as polymerizable sealant compositions in applications where low temperature flexibility and fuel resistance are important. Such sealant compositions are useful, e.g., as aerospace sealants. A first preferred polymerizable composition thus includes at least one polythioether as described herein; a curing agent or combination of curing agents; and a filler.

The polythioether or combination of polythioethers preferably is present in the polymerizable composition in an amount from about 30 wt % to about 90 wt %, more preferably about 40 to about 80 wt %, very preferably about 45 to about 75 wt %, with the wt % being calculated based on the weight of all non-volatile components of the composition. Preferably, the $T_g$ of the polythioether(s) used in the polymerizable composition is not greater than about $-55°$ C., more preferably not greater than about $-60°$ C.

Curing agents useful in polymerizable compositions of the invention include epoxy resins, for example, hydantoin diepoxide, diglycidyl ether of bisphenol-A epoxides, diglycidyl ether of bisphenol-F epoxides, Novolak type epoxides, and any of the epoxidized unsaturated and phenolic resins. Other useful curing agents include unsaturated compounds such as acrylic and methacrylic esters of commercially available polyols, unsaturated synthetic or naturally occurring resin compounds, TAC (triallyl cyanurate), and olefinic terminated derivatives of the compounds of the present invention. In addition, useful cures can be obtained through oxidative coupling of the thiol groups using organic and inorganic peroxides (e.g., $MnO_2$) known to those skilled in the art. Selection of the particular curing agent may affect the $T_g$ of the cured composition. For example, curing agents that have a $T_g$ significantly lower than the $T_g$ of the polythioether may lower the $T_g$ of the cured composition.

Depending on the nature of the polythioether(s) used in the composition, the composition will contain about 90% to about 150% of the stoichiometric amount, preferably about 95 to about 125%, of the selected curing agent(s).

Fillers useful in the polymerizable compositions of the invention include those commonly used in the art, such as carbon black and calcium carbonate ($CaCO_3$). Preferably, the compositions include about 5 to about 60 wt % of the selected filler or combination of fillers, very preferably about 10 to 50 wt %.

The polythioethers, curing agents and fillers employed in polymerizable compositions of the invention, as well as optional additives as described below, should be selected so as to be compatible with each other. Selection of compatible ingredients for the inventive compositions can readily be performed by those skilled in the art without recourse to undue experimentation.

The foregoing polymerizable compositions preferably are curable at a minimum temperature of about 0° C., more preferably about −10° C., very preferably about −20° C., and have a $T_g$ when cured not higher than about —55° C., more preferably not greater than —60° C., and very preferably not greater than —65° C. When cured, the polymerizable compositions preferably have a % volume swell not greater than 25% after immersion for one week at 60° C.(140° F.) and ambient pressure in jet reference fluid (JRF) type 1.

In addition to the foregoing ingredients, polymerizable compositions of the invention can optionally include one or more of the following: pigments; thixotropes; accelerators; retardants; adhesion promoters; and masking agents.

Useful pigments include those conventional in the art, such as carbon black and metal oxides. Pigments preferably are present in an amount from about 0.1 to about 10 wt %.

Thixotropes, for example silica, are preferably used in an amount from about 0.1 to about 5 wt %.

Accelerators known to the art, such as amines, preferably are present in an amount from about 0.1 to about 5 wt %. Two such useful accelerators are 1,4-diaza-bicyclo[2.2.2]octane (DABCO®, commercially available from Air Products, Chemical Additives Division, Allentown, Pa.) and DMP-30® (an accelerant composition including 2,4,6-tri(dimethylaminomethyl)phenol, commercially available from Rohm and Haas. Philadelphia, Pa.).

Retardants, such as stearic acid, likewise preferably are used in an amount from about 0.1 to about 5 wt %. Adhesion promoters, which can be, for example, conventional phenolics or silanes, if employed are preferably present in amount from about 0.1 to about 5 wt %. Masking agents, such as pine fragrance or other scents, which are useful in covering any low level odor of the composition, are preferably present in an amount from about 0.1 to about 1 wt %.

A second preferred polymerizable composition combines one or more plasticizers with the polythioether(s), curing agent(s) and filler(s) described above. Use of a plasticizer allows the polymerizable composition to include polythioethers which have higher $T_g$ than would ordinarily be useful in an aerospace sealant. That is, use of a plasticizer effectively reduces the $T_g$ of the composition, and thus increases the low-temperature flexibility of the cured polymerizable composition beyond that which would be expected on the basis of the $T_g$ of the polythioethers alone.

Plasticizers that are useful in polymerizable compositions of the invention include phthalate esters, chlorinated paraffins, hydrogenated terphenyls, etc. The plasticizer or combination of plasticizers preferably constitute 1 to about 40 wt %, more preferably 1 to about 10 wt % of the composition.

The foregoing polymerizable compositions also preferably are curable at a minimum temperature of about 0° C., more preferably about —10° C., very preferably about —20° C.

The present invention is illustrated in more detail by means of the following non-limiting examples.

In examples 1–4, a liquid polythioether oligomer was first prepared by combining a dithiol with a divinyl ether in the presence of an acid catalyst. The oligomer was then reacted with a polyfuntionalizing agent to produce a polyfunctional polymer.

EXAMPLE 1

Into a 1000 mL 3-neck flask with a stirrer and a thermometer were added 192 g (1.20 mol) dimercaptodiethylsulfide (DMDS), 350 g toluene and 66 g concentrated HCl. 58 g (0.41 mol) Butanediol divinyl ether (BD-DVE) were added all at once, and the mixture was stirred for 4.5 hours. An aqueous layer was removed, and the remaining mixture was allowed to settle for 72 hours. The organic layer was then decanted and the toluene was removed. The organic layer was heated for 48 hours at 200° F. A clear, colorless liquid oligomer was obtained (weight average molecular weight $M_w$=544) having a mercaptan equivalent (ME) of 272.

Next, 4.3 g of the oligomer was placed in a small glass jar together with 11.0 g (44 mmol mol) PLURIOL® E-200 divinyl ether, 9.5 g (52 mmol) dimercaptodioxaoctane (DMDO) and 0.99 g (4 mmol) triallylcyanurate (TAC). Then 0.25 g (1.3 mmol) of an azobisnitrile free radical catalyst (VAZO® 67 [2,2'-azobis(2-methylbutyronitrile) commercially available from DuPont.) was stirred into the reaction mixture. The reaction mixture was heated to 180° F. for about 4 hours, then to 200° F. for about 1.5 hours, to afford 25 g (8 mmol, yield 100%) of a liquid polythioether resin ($M_w$=316) having an ME of 1164, a $T_g$ of −65° C., a viscosity of 52 poise and a functionality F of 2.5.

EXAMPLE 2

192 g (1.20 mol) DMDS, 350 g toluene and 66 g concentrated HCl were mixed in a flask as in Example 1, and 73 g (0.51 mol) BD-DVE were added all at once. The mixture was reacted as in Example 1 to afford a thick, cloudy liquid oligomer having an ME of 576 and $T_g$ of −60° C. $M_w$=1152. F.=2.0.

Next, 69.7 g of the oligomer was placed in a 100 ml container together with 5.15 g (32 mmol) diethylene glycol divinyl ether and 1.01 g (4 mmol) TAC. Then 0.35 g (1.8 mmol) of VAZO® 67 was stirred into the reaction mixture. The mixture was reacted as in Example 1 to afford 70 g (20 mmol, yield 100%) of a liquid polythioether resin ($M_w$= 3450) having an ME of 1573, a $T_g$ of −49° C., a viscosity of 336 poise and a functionality F of 2.2.

EXAMPLE 3

192 g (1.20 mol) DMDS, 350 g toluene and 66 g concentrated HCL were mixed in a flask as in Example 1, and 43.5 g (0.31 mol) BD-DVE were added all at once. The mixture was reacted as in Example 1 to afford a liquid oligomer having an ME of 168 and $M_w$ of about 340.

23.0 g of this material was mixed with 8.9 g (0.05 mol) hexanediol divinyl ether in a small glass jar. 0.13 g (0.7 mmol) of VAZO® 67 was added as a catalyst. The mixture was heated at 180° F. for about 20 hours, after which it was degasssed at 210° F. for one hour to afford a product having a ME of 1012, a viscosity of 104 poise, and a $T_g$ of −59° C. After curing with a stoichiometric amount of DEN 431 epoxy novalac resin, the material had the following properties:

| | |
|---|---|
| Hardness | 42 Type A durometer |
| Tg | −47 |
| % volume swell in JRF Type 1 | 27% |
| Volume resistivity | $1.1 \times 10^{12}$ Ω-cm |
| Surface resistivity | $4.0 \times 10^{11}$ Ω |

EXAMPLE 4

83.9 g (0.53 mol) 1,6-hexanedithiol (HDT), 154 g toluene and 29 g concentrated HCl were mixed in a flask as in Example 1, and 25.5 g (0.18 mol) BD-DVE were added all at once. The mixture was reacted as in Example 1, then washed with methanol to afford a liquid oligomer having an ME of 327. $M_w$=654.

Next, 21.0 g of the oligomer was placed in a small glass jar together with 3.1 g (20 mmol) diethyleneglycol divinyl ether (DEG-DVE) and 0.80 g (3.2 mol) of TAC. Then 0.20 g (1.0 mmol) of VAZO® 67 was stirred into the reaction mixture. The mixture was reacted as in Example 1 to afford 25 g (6.4 mmol, yield 100%) of a liquid polythioether resin ($M_w$=3900) having an ME of 1515, a $T_g$ of −76° C., and a functionality F. of 2.5. Upon curing as in Example 3, the resin had a $T_g$ of −66° C. The cured material had a volume resistivity of $3.2 \times 10^{10} \Omega$ In Examples 5–8, liquid oligomers were prepared.

EXAMPLE 5

34.3 g (0.21 mol) DMDS, 100 ml toluene and 11 g concentrated HCl were mixed in a flask as in Example 1, and 18.9 g (0.13 mol) ethylene glycol butylvinyl ether (EG-BVE, a monovinyl ether) were added all at once. The mixture was reacted as in Example 1 to afford a clear liquid oligomer. $M_w$32 430.

EXAMPLE 6

111 g (0.70 mol) DMDS, 200 ml toluene and 43 g concentrated HCl were mixed in a flask as in Example 1, and 27.8 g (0.19 mol) ethyl vinyl ether (EVE, a monovinyl ether) were added all at once. The material was mixed as in Example 1 but not heat-aged to afford a clear liquid oligomer having an ME of 187.

EXAMPLE 7

41.3 g (0.26 mol) DMDS, 100 ml toluene and 19.1 g concentrated HCl were mixed in a flask as in Example 1, and 12.3 g (58 mmol) trimethylolpropane trivinyl ether (TMP-TVE, a trivinyl ether) were dripped in slowly. The material was mixed as in Example 1 but not heat-aged. After washing with methanol, a liquid polymer was obtained with an ME of 376 and a $M_w$ of 724.

EXAMPLE 8

4.14 g (30 mmol) 1,5-pentanedithiol, 15 ml toluene and 1.6 g concentrated HCl were mixed in a 50 ml, and 1.44 g (10 mmol) BD-DVE were added slowly. The material was mixed for 4 hours, rotovapped to remove solvent, and heat-aged for 3 days at 200° F. to afford a liquid polymer with an ME of 233.

EXAMPLE 9

48 g (0.30 mol) DMDS, 14.5 g (0.10 mol) BD-DVE, 100 g toluene, 0.1 g $ZnCl_2$ and 3 drops $H_2O$ were mixed in a 250 ml flask. The mixture was stirred for 4 hours. Aqueous NaCl was added to the mixture to help separate the two layers. The organic layer was dried and heated to 110° C. to afford a clear liquid oligomer having an ME of 146.

EXAMPLE 10 High resistivity composition

The following mixture was prepared:

| | | |
|---|---|---|
| Oligomer of Example 1 | 10 g | |
| DEN 431 | 6.7 g | |
| DABCO | 0.02 g | |

The mixture was heated at 140° F. (60° C.) overnight to cure. The cured material had a $T_g$ of −22° C., a durometer reading of 65 (Rex gauge), and a volume resistivity of >$1 \times 10^{13}$ Ω. After four days in pure toluene at 140° F, the cured material showed a weight gain of 18%. After drying, no stress cracking was observed. The cured material was clear and colorless.

EXAMPLE 11 High resistivity composition

The following mixture was prepared:

| | | |
|---|---|---|
| TAC | 3.4 g | (14 mmol) |
| 1,6-hexadiene | 6.81 g | (83 mmol) |
| Oligomer of Example 1 | 79.69 g | (136 mmol) |

The ingredients were mixed in a 100 ml flask and reacted with 0.4 g (1.6 mmol) VAZO® 52 (2,2'-azobis(2,4-dimethylvaleronitrile)) at 140° F. for about 4 hours. Then 0.2 g VAZO® 67 (1.0 mmol) was added, and the material was heated a few more hours at 200° F. The reaction product was then degassed to afford 90 g (100% yield) of a thick opaque liquid with a mercaptan equivalent of 1154 and a $T_g$ of −56 C. $M_w$=3100. F=2.5.

When 10 g of this polymer were mixed with 5 g $CaCO_3$ and cured as described in Example 10, the material had a $T_g$ of −46° C. and 9% fuel swell in JRF type 1. The volume resistivity was $1.2 \times 10^{11}$ Ω.

EXAMPLE 12 High resistivity material

The following mixture was prepared:

| | | |
|---|---|---|
| TAC | 3.2 g | (13 mmol) |
| 1,9 decadiene | 11.01 g | (77 mmol) |
| Oligmer of Example 1 | 75.25 g | (128 mmol) |

The ingredients were mixed in a 100 ml flask with 0.85 g VAZO® 67 (3.4 mmol) at 160–180° F. for about 7 hours, and then degassed to afford 90 g (100% yield) of a soft solid with a mercaptan equivalent of 1203 and a $T_g$ of −57° C. $M_w$=3500, F=2.5.

When 10 g this polymer were mixed with 5 g $CaCO_3$ and cured as described in Example 10, the material had a $T_g$ was −50° C. and 15% fuel swell in JRF type 1. The volume resistivity was $4.5 \times 10^{11}$ Ω.

EXAMPLE 13

Into a 500 ml 3-neck flask with a stirrer and thermometer were added 56 g (0.35 mol) DMDS, 32 g (0.20 mol) hexanedithiol (HDT), 165 g toluene, and 36 g concentrated HCl. 36 g (0.25 mol) BD-DVE were added quickly (over 10 minutes) and the reaction mixture stirred for 2.5 hours. After settling for 72 hours, the aqueous layer was removed. The organic layer was decanted and the toluene removed. The material was heated for 72 hours at 200° F. and then degassed at 210–240° F. for about 1 hour. A colorless liquid was obtained with $M_w$ of about 2000. The mercaptan equivalent was 1032. Viscosity at 25° C.=109 poises. $T_g$=−60 C.

When this material was cured with a stoichiometric amount of DEN 431 epoxy novalac resin, the following properties were obtained:

| | |
|---|---|
| Hardness | 50 (Type A durometer) |
| $T_g$ | −51 |
| % volume swell in JRF Type 1 | 27% |
| Volume resistivity | $1.028 \times 10^{12}$ Ω |
| Surface resistivity | $5.66 \times 10^{11}$ Ω-cm |

This material has good low-temperature flexibility, passing a bend around a 2" diameter mandrel at −50° C.

EXAMPLE 14

192 g (1.20 mol) DMDS and 6.6 g (0.04 mol) trivinylcyclohexane (TVCH) were mixed and heated in a 250 ml 3-neck flask with stirrer and thermometer. A total of 0.4 g VAZO® 67 (2 mmol) was added, and the mixture was heated for about 4 hours at 190–200° F. The IR spectrum indicates an absence of C=C bonds.

32 g of the foregoing solution, 31 g (0.2 mol) DMDS, 100 g toluene and 20 g concentrated HCl were mixed in a 250 ml 3-neck flask with stirrer and thermometer. 25 g (0.17 mol) BD-DVE were added quickly. The mixture was stirred for 3 hours and allowed to settle for 72 hours. The organic and aqueous layers were separated and the toluene removed from the organic layer. After 5 days at 200° F., the material was degassed at 210–240° F. to yield a clear, colorless liquid with a mercaptan equivalent of 1163 and $T_g$ of −47° C.

When cured with a difunctional bisphenol A epoxy resin, a hardness of 40 (type A durometer) was observed.

What is claimed is:

1. A polythioether having the formula I $$R^1-[-R^2-S-CH(CH_3)-S-]_n-R^2-R^1 \qquad I$$

wherein

R$^1$ denotes a thiol group, a hydroxyl group, an unsubstituted amine group, a monoalkyl-substituted amine group, a monovalent radical substituted with at least one hydroxyl group, unsubstituted amine group or monoalkyl-substituted amine group, or a group that is non-reactive in the presence of an acid catalyst, R$^2$ denotes a divalent radical, and n is an integer from 1 to 60, said polythioether being a liquid at room temperature and pressure.

2. The polythioether of claim 1 which has a glass transition temperature $T_g$ not higher than −50° C.

3. The polythioether of claim 1 which, when cured, has a % volume swell not greater than 25% after immersion for one week in JRF type 1 at 60° C. and ambient pressure.

4. The polythioether of claim 1 which has a number average molecular weight between about 500 and 20,000.

5. The polythioether of claim 1 which has a volume electrical resistivity of at least $1.0 \times 10^{11}$ Ω.

6. The polythioether of claim 1 wherein said divalent radical is selected from the group consisting of a $C_{2-6}$ n-alkylene group, a $C_{3-6}$ branched alkylene group, a $C_{6-8}$ cycloalkylene group, a $C_{6-10}$ alkylcycloalkylene group, a —[(—CH—)$_2$—X$_p$—]$_q$—(—CH$_2$—)$_r$— group, or a —[(—CH$_2$—)$_p$—X—]$_q$—(—CH$_2$—)$_r$— group in which at least one —CH$_2$— unit is substituted with a methyl group, and wherein X denotes one selected from the group consisting of O, S and —NR$^3$—, R$^3$ denotes H or methyl, p is an integer from 2 to 6, q is an integer from 1 to 5, and r is an integer from 2 to 10.

7. The polythioether of claim 1 wherein R$^1$ is —SH.

8. A method of producing the polythioether of claim 7 which comprises the step of reacting (n) equivalents of a compound having the formula II $$HS-R^1-SH \qquad II$$

or a mixture of at least two different compounds having the formula II, and (n−1)/m equivalents of a compound having the formula III $$R^8-[-O-CH=CH_2]_m \qquad III$$

wherein m is an integer ≧1, and

R$^8$ denotes an m-valent radical, or a mixture of at least two different compounds having the formula III, in the presence of an acid catalyst.

9. The method of claim 8 wherein m is an integer from 2 to 6.

10. A polyfunctional polythioether having the formula IV $$B-(-S-[-R^2-S-CH(CH_3)-S-]_n-R^2-R^1)_z \qquad IV$$

wherein

R$^1$ denotes a thiol group, a hydroxyl group, an unsubstituted amine group, a monoalkyl-substituted amine group, a monovalent radical substituted with at least one hydroxyl group, unsubstituted amine group or monoalkyl-substituted amine group, or a group that is non-reactive in the presence of an acid catalyst, R$^2$ denotes a divalent radical, n is an integer from 1 to 60, z is an integer from 3 to 6, and B denotes a z-valent residue of a polyfunctionalizing agent.

11. The polythioether of claim 10 wherein z=3.

12. The polythioether of claim 11 which has an average functionality from about 2.05 to 3.00.

13. The polythioether of claim 10 wherein R$^1$ is —SH.

14. A method of producing the polyfunctional polythioether of claim 10 which comprises the steps of (i) reacting (n) equivalents of a compound having the formula II $$HS-R^1-SH \qquad II$$

or a mixture of at least two different compounds having the formula II, with (n−1)/m equivalents of a compound having the formula III $$R^8-[-O-CH=CH_2]_m \qquad III$$

wherein m is an integer ≧1, and

R$^8$ denotes an m-valent radical, or a mixture of at least two different compounds having the formula III, in the presence of an acid catalyst to produce a difunctional liquid polythioether, and subsequently (ii) reacting said polythioether with a polyfunctionalizing agent to form a polyfunctional polythioether.

15. The polythioether of claim 1 wherein

R$^1$ denotes —S—(—CH$_2$—)$_2$—O—R$^4$, and

R$^4$ denotes a monovalent radical substituted with at least one hydroxyl group, unsubstituted amine group or monoalkyl-substituted amine group, or a group that is non-reactive in the presence of an acid catalyst.

16. The polythioether of claim 15 wherein
$R^4$ denotes $C_{1-6}$ n-alkyl which is unsubstituted or substituted with at least one —OH or —$NHR^5$ group, and
$R^5$ denotes H or a $C_{1-6}$ n-alkyl group.

17. A method of producing the polythioether of claim 15 which comprises the steps of
(i) reacting (n) equivalents of a compound having the formula II $$HS-R^1-SH \qquad \text{II}$$

or a mixture of at least two different compounds having the formula II, with (n−1)/m equivalents of a compound having the formula III $$R^8-[-O-CH=CH_2]_m \qquad \text{III}$$

wherein
m is an integer $\geq 1$, and
$R^8$ denotes an m-valent radical,
or a mixture of at least two different compounds having the formula III, in the presence of an acid catalyst to produce an uncapped polythioether, and subsequently
(ii) reacting said uncapped thioether with about 0.05 to about 2 equivalents of a compound having the formula V $$CH_2=CH-O-R^4 \qquad \text{V}$$

or a mixture of two different compounds having the formula V, in the presence of a free-radical catalyst.

18. The method of claim 17 wherein m is an integer from 2 to 6.

19. The polyfunctional polythioether of claim 10 wherein
$R^1$ denotes —S—(—$CH_2$—)$_2$—O—$R^4$,
$R^4$ denotes a monovalent radical substituted with at least one hydroxyl group, unsubstituted amine group or monoalkyl-substituted amine group, or a group that is non-reactive in the presence of an acid catalyst.

20. The polyfunctional polythioether of claim 19 wherein
$R^4$ denotes $C_{1-6}$ n-alkyl which is unsubstituted or substituted with at least one —OH or —$NHR^5$ group, and
$R^5$ denotes H or a $C_{1-6}$ n-alkyl group.

21. A method of producing the polythioether of claim 19 which comprises the steps of
(i) reacting (n) equivalents of a compound having the formula II $$HS-R^1-SH \qquad \text{II}$$

or a mixture of at least two different compounds having the formula II, with (n−1)/m equivalents of a compound having the formula III $$R^8-[-O-CH=CH_2]_m \qquad \text{III}$$

wherein
m is an integer $\geq 1$, and
$R^8$ denotes an m-valent radical,
or a mixture of at least two different compounds having the formula III, in the presence of an acid catalyst to produce a difunctional liquid polythioether,
(ii) reacting said polythioether with a z-valent polyfunctionalizing agent, wherein z is an integer from 3 to 6, to form a polyfunctional polythioether, and
(iii) reacting said polyfunctional polythioether with about 0.05 to about z equivalents of a compound having the formula V $$CH_2=CH-O-R^5 \qquad \text{V}$$

or a mixture of two different compounds having the formula V, in the presence of a free-radical catalyst.

22. A method of producing a polythioether comprising the step of reacting (n+1) moles of a compound of claim 7 or a mixture of at least two different said compounds with (n) moles of a compound having the formula VI $$CH_2=CH-O-[-R^{11}-O-]_k-CH=CH_2 \qquad \text{VI}$$

wherein
$R^{11}$ denotes a $C_{2-6}$ n-alkyl, $C_{2-6}$ branched alkylene, $C_{6-8}$ cycloalkylene or $C_{6-10}$ alkylcycloalkylene group, a $-[(-CH_2-)_p-X-]_q-(-CH_2-)_r-$ group, or a $-[(-CH_2-)_p-X-]_q-(-CH_2-)_r-$ group in which at least one —$CH_2$— unit is substituted with a methyl group,
X denotes one selected from the group consisting of O, S and —$NR^3$—,
$R^3$ denotes H or methyl,
p is an integer from 2 to 6,
q is an integer from 1 to 5,
r is an integer from 2 to 10, and
k is a rational number from 0 to 10,
or a mixture of at least two different compounds having the formula VI, in the presence of a catalyst selected from the group consisting of free-radical catalysts, ionic catalysts and ultraviolet light.

23. A method of producing a polythioether comprising the step of reacting (n) moles of a compound of claim 7 or a mixture of at least two different said compounds with (n+1) moles of a compound having the formula VI $$CH_2=CH-O-[-R^{11}-O-]_k-CH=CH_2 \qquad \text{VI}$$

wherein
$R^{11}$ denotes a $C_{2-6}$ n-alkyl, $C_{2-6}$ branched alkylene, $C_{6-8}$ cycloalkylene or $C_{6-10}$ alkylcycloalkylene group, a $-[(-CH_2-)_p-X-]_q-(-CH_2-)_r-$ group, or a $-[(-CH_2)_p-X-]_q-(-CH_2-)_r-$ group in which at least one —$CH_2$— unit is substituted with a methyl group,
X denotes one selected from the group consisting of O, S and —$NR^3$—,
$R^3$ denotes H or methyl,
p is an integer from 2 to 6,
q is an integer from 1 to 5,
r is an integer from 2 to 10, and
k is a rational number from 0 to 10,
or a mixture of at least two different compounds having the formula VI, in the presence of a catalyst selected from the group consisting of free-radical catalysts, ionic catalysts and ultraviolet light.

24. A polythioether produced by the method of claim 22.

25. A polythioether produced by the method of claim 23.

26. A method of producing a polythioether comprising the step of reacting (n+1) moles of a compound of claim 7 or a mixture of at least two different said compounds with (n) moles of a compound having the formula VI $$CH_2=CH-O-[-R^{11}-O-]_k-CH=CH_2 \qquad \text{VI}$$

wherein

R$^{11}$ denotes a C$_{2-6}$ n-alkyl, C$_{2-6}$ branched alkylene, C$_{6-8}$ cycloalkylene or C$_{6-10}$ alkylcycloalkylene group, a —[(—CH$_2$—)$_p$—X—]$_q$—(—CH$_2$—)$_r$— group, or a —[(—CH$_2$—)$_p$—X—]$_q$—(—CH$_2$—)$_r$— group in which at least one —CH$_2$— unit is substituted with a methyl group, X denotes one selected from the group consisting of O, S and —NR$^3$—, R$^3$ denotes H or methyl, p is an integer from 2 to 6, q is an integer from 1 to 5, r is an integer from 2 to 10, and k is a rational number from 0 to 10, or a mixture of at least two different compounds having the formula VI, and about 0.05 to about 2 equivalents of a compound having the formula V $$CH_2{=}CH{-}O{-}R^4 \qquad V$$

or a mixture of two different compounds having the formula V, wherein

R$^4$ denotes C$_{1-6}$ n-alkyl which is unsubstituted or substituted with at least one —OH or —NHR$^5$ group, and R$^5$ denotes H or a C$_{1-6}$ n-alkyl group, in the presence of a catalyst selected from the group consisting of free-radical catalysts, ionic catalysts and ultraviolet light.

27. A method of producing a polythioether comprising the step of reacting (n) moles of a compound of claim 7 or a mixture of at least two different said compounds with (n+1) moles of a compound having the formula VI $$CH_2{=}CH{-}O{-}[{-}R^{11}{-}O{-}]_k{-}CH{=}CH_2 \qquad VI$$

wherein

R$^{11}$ denotes a C$_{2-6}$ n-alkyl, C$_{2-6}$ branched alkylene, C$_{6-8}$ cycloalkylene or C$_{6-10}$ alkylcycloalkylene group, a —[(—CH$_2$—)$_p$—X—]$_q$—(—CH$_2$—)$_r$— group, or a —[(—CH$_2$—)$_p$—X—]$_q$—(—CH$_2$—)$_r$— group in which at least one —CH$_2$— unit is substituted with a methyl group, X denotes one selected from the group consisting of O, S and —NR$^3$—, R$^3$ denotes H or methyl, p is an integer from 2 to 6, q is an integer from 1 to 5, r is an integer from 2 to 10, and k is a rational number from 0 to 10, or a mixture of at least two different compounds having the formula VI, and about 0.05 to about 2 equivalents of a compound having the formula VII $$HS{-}R^4 \qquad VII$$

or a mixture of two different compounds having the formula VII, wherein

R$^4$ denotes C$_{1-6}$ n-alkyl which is unsubstituted or substituted with at least one —OH or —NHR$^5$ group, and R$^5$ denotes H or a C$_{1-6}$ n-alkyl group, in the presence of a catalyst selected from the group consisting of free-radical catalysts, ionic catalysts and ultraviolet light.

28. A polythioether produced by the method of claim 26.

29. A polythioether produced by the method of claim 27.

* * * * *